United States Patent
Otsuka

(10) Patent No.: US 11,423,294 B2
(45) Date of Patent: Aug. 23, 2022

(54) NEURAL NETWORK CIRCUIT

(71) Applicant: DENSO CORPORATION, Kariya (JP)

(72) Inventor: Shigeki Otsuka, Kariya (JP)

(73) Assignee: DENSO CORPORATION, Kariya (JP)

( * ) Notice: Subject to any disclaimer, the term of this patent is extended or adjusted under 35 U.S.C. 154(b) by 677 days.

(21) Appl. No.: 16/449,932

(22) Filed: Jun. 24, 2019

(65) Prior Publication Data
US 2020/0026993 A1 Jan. 23, 2020

(30) Foreign Application Priority Data

Jul. 18, 2018 (JP) .............................. JP2018-134983

(51) Int. Cl.
| | |
|---|---|
| *H03M 1/00* | (2006.01) |
| *G06N 3/063* | (2006.01) |
| *G06N 3/04* | (2006.01) |
| *G11C 13/00* | (2006.01) |
| *H01L 45/00* | (2006.01) |

(Continued)

(52) U.S. Cl.
CPC ............. *G06N 3/0635* (2013.01); *G06N 3/04* (2013.01); *G11C 11/54* (2013.01);
(Continued)

(58) Field of Classification Search
CPC .......... H03M 1/145; H03M 1/66; H03M 1/34; H03M 1/365; H03M 1/46; H03M 1/462; H03M 1/1033; H03M 1/1076; H03M 1/144; H03M 1/361; H03M 1/56; H03M 1/80; H03M 1/808; H03M 5/02; H04N 5/378; H04N 5/357; H04N 5/3742; H04N 5/37455; H04N 5/369; H04N 5/374; H04N 5/3745; H04N 9/045; H04N 9/04557; G06N 3/0635; G06N 3/063; G06N 3/08; G06N 3/0454; G06N 3/0445; G06N 3/049; G06N 3/0481;
(Continued)

(56) References Cited

U.S. PATENT DOCUMENTS

| | | | | |
|---|---|---|---|---|
| 7,835,174 | B2 * | 11/2010 | Tokiwa ................... | G11C 13/00 365/100 |
| 9,183,932 | B1 * | 11/2015 | Kwon ................... | G11C 11/1675 |

(Continued)

OTHER PUBLICATIONS

Qureshi et al., "CMOS Interface Circuits for Reading and Writing Memristor Crossbar Array," 2011 IEEE International Symposium of Circuits and Systems (ISCAS), 978-1-4244-9474-3/11, May 2011, pp. 2954-2957.

(Continued)

*Primary Examiner* — Linh V Nguyen
(74) *Attorney, Agent, or Firm* — Posz Law Group, PLC

(57) ABSTRACT

A neural network circuit includes: multiple storage portions that include a memristor; multiple D/A converters that receive data, causing a signal voltage to be applied to multiple voltage input terminals of the storage portions; multiple drive amplifiers that are connected between to the D/A converters and the voltage input terminals; multiple I/V conversion amplifiers that are connected to at least one current output terminal of the storage portions; multiple A/D converters; and a series circuit of a first switch and a second switch that is disposed in a feedback loop of each of the drive amplifiers; and a series circuit of a third switch and a fourth switch that is disposed in a feedback loop of each of the I/V conversion amplifiers.

5 Claims, 9 Drawing Sheets

(51) Int. Cl.
  *G11C 11/54* (2006.01)
  *H03M 1/66* (2006.01)
(52) U.S. Cl.
  CPC .......... *G11C 13/0002* (2013.01); *H01L 45/04* (2013.01); *H03M 1/66* (2013.01)
(58) Field of Classification Search
  CPC ............ G06N 3/04; G06N 3/082; G06N 3/02; G06N 3/086; G06N 3/10; G06N 3/084; G06N 5/046; G06N 20/00; G06N 3/0675; G06N 3/088; G06N 7/005; G06N 3/0472; G06N 10/00; G06N 20/10; G06N 3/06; G06N 5/003; G06N 5/04
  USPC ................. 341/110, 122, 142, 144, 155, 159
  See application file for complete search history.

(56) References Cited

U.S. PATENT DOCUMENTS

| | | | |
|---|---|---|---|
| 10,170,181 B2* | 1/2019 | Jo | G11C 13/0061 |
| 2014/0172937 A1* | 6/2014 | Linderman | G06G 7/16 |
| | | | 708/607 |
| 2017/0228345 A1* | 8/2017 | Gupta | G06F 17/141 |
| 2018/0025790 A1* | 1/2018 | Merced Grafals | |
| | | | G11C 13/0021 |
| | | | 365/148 |
| 2018/0309451 A1* | 10/2018 | Lu | H04Q 3/0004 |
| 2018/0321942 A1* | 11/2018 | Yu | G06F 7/00 |
| 2019/0147329 A1* | 5/2019 | Hekmatshoartabari | |
| | | | G06N 3/0635 |
| | | | 706/26 |

OTHER PUBLICATIONS

Yeh et al., "Compact One-Transistor-N-RRAM Array Architecture for Advanced CMOS Technology," IEEE Journal of Solid-State Circuits, vol. 50, No. 5, May 2015, pp. 1299-1309.

Wang et al., "Low Power Convolutional Neural Networks on a Chip," 2016 IEEE Symposium on Circuits and Systems, (ISCAS), 978-1-4799-5341-7/16, May 2016, pp. 129-132.

* cited by examiner

NEURAL NETWORK CIRCUIT

CROSS REFERENCE TO RELATED APPLICATION

The present application claims the benefit of priority from Japanese Patent Application No. 2018-134983 filed on Jul. 18, 2018. The entire disclosures of all of the above applications are incorporated herein by reference.

TECHNICAL FIELD

The present disclosure relates to a neural network circuit including a storage portion that includes a memristor, as a storage element, connected in a lattice shape.

BACKGROUND

There are researches on a neural network circuit using a two-terminal element as synapse.

SUMMARY

The present disclosure provides multiple storage portions; multiple D/A converters; multiple drive amplifiers that are connected between to the D/A converters and the voltage input terminals of the storage portions; multiple I/V conversion amplifiers; multiple A/D converters that are configured to perform A/D conversion of a signal voltage; and a series circuit of a first switch and a second switch that is disposed in a feedback loop of each of the drive amplifiers; and a series circuit of a third switch and a fourth switch that is disposed in a feedback loop of each of the I/V conversion amplifiers.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

There are researches on a neural network circuit using a two-terminal element as synapse. The two-terminal element is non-volatile and variable in conductance value, and is referred to as a memristor. For example, it has known that a memristor is arranged in a lattice shape and a D/A converter applies analog voltage to generate current.

A composite current is converted into voltage by a transimpedance amplifier, and converted into digital data by an A/D converter. Then, after performing calculation by an activation function, signal processing such as pooling is performed as necessary. The output data is sent to a D/A converter in a next signal processing layer, and signal processing is performed in multiple layers. At this time, a product-sum operation is executed in a crossbar portion that is configured by the memristor.

Figure 11:
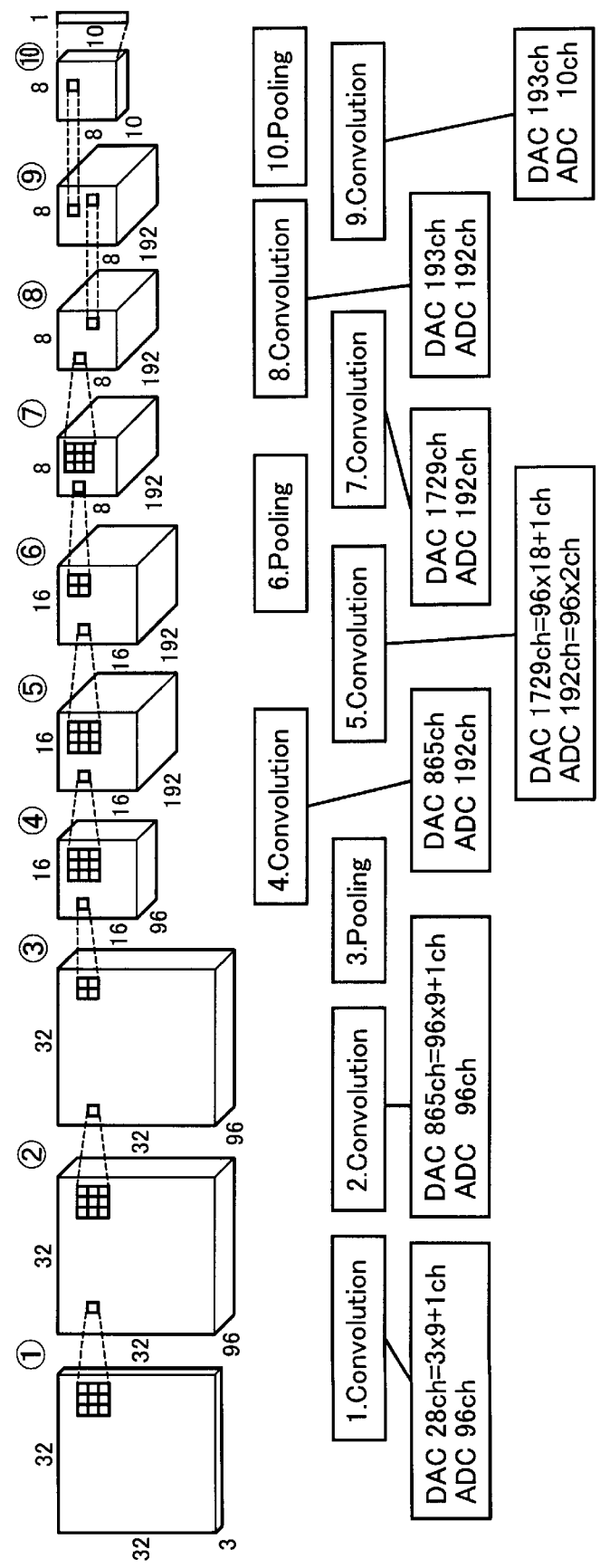
FIG. 11 is a diagram showing a example of a ten-layer CNN by using a circuit.

FIG. 11 shows an example illustrating a ten-layer CNN (convolutional neural network) for performing image recognition which is configured based on a circuit configuration. FIG. 11 shows the number of channels required of an input DAC and the number of channels required of an output ADC for each signal process layer. The convolution layer (a convolution layer) in the first layer is configured with 28 input channels and 96 output channels.

The second layer is configured with 865 channels of input and 96 channels of output. The 865 channels of input (that is, 965 input channels) is obtained through 96×9+1 channels, which is obtained by adding 1 bias channel to nine data of 96 channels of the output in the first layer.

At this time, it is assumed that a basic cell configuration of the second layer is a combination of a crossbar having input 96ch/an output 96ch and a crossbar having an input 1ch/an output 96ch. In this case, the same operation result as the crossbar having the input 865ch/output 96ch can be obtained by taking the sum of the output of nine times of product-sum operations of input 96ch/output 96ch crossbar and one time of product-sum operation of input 1ch/output 96ch. The number of output ADCs and the number of input ADCs in a next stage may be made equal, except for one DAC for bias. When this configuration is made by an integrated circuit (IC), it may be necessary to reduce the DAC and ADC in terms of power consumption and area.

The present disclosure provides a neural network circuit that enables to reduce circuit scale while maintaining calculation accuracy and signal process speed.

According to one aspect of the present disclosure, a neural network circuit may include: multiple storage portions that include a memristor, the memristor being a variable resistance element as a storage element and being connected in a lattice shape; multiple D/A converters that receive data, causing a signal voltage to be applied to multiple voltage input terminals of the storage portions; multiple drive amplifiers that are connected between to the D/A converters and the voltage input terminals; multiple I/V conversion amplifiers that are connected to at least one current output terminal of the storage portions and are configured to convert a current flowing in the current output terminal into voltage to be output as a signal voltage; multiple A/D converters that are configured to perform A/D conversion of the signal voltage, which is converted by the I/V conversion amplifiers; and a series circuit of a first switch and a second switch that is disposed in a feedback loop of each of the drive amplifiers; and a series circuit of a third switch and a fourth switch that is disposed in a feedback loop of each of the I/V conversion amplifiers. A common connection point of the first switch and the second switch is connected to one end of the memristor. A common connection point of the third switch and the fourth switch is connected to another end of the memristor. The A/D converter performs A/D conversion of voltage across a feedback resistor of the I/V conversion amplifier.

According to this configuration, the first to fourth switches are turned on and off, and thereby it may be possible to switch a connection between a drive amplifier positioned toward input of the storage portion and the I/V conversion amplifier positioned toward output of the storage portion for each storage portion. Therefore, when a large scale network is configured using multiple storage portions, it may be possible to share the D/A converter and driver amplifier, and the I/V conversion amplifier and the A/D converter, and thereby it may be possible to reduce the circuit scale while maintaining the calculation accuracy.

Furthermore, the neural network circuit may include a fifth switch that is connected between an output terminal of the drive amplifier and an inversion input terminal of the drive amplifier; and a sixth switch that is connected between an inversion input terminal of the I/V conversion amplifier and one end of the feedback resistor.

When switching the connection between each amplifier on an input side or an output side and the storage portion by the first to fourth switches, the amplifier may be temporarily in an open loop state depending on a switching timing and frequency characteristics of the amplifier. The output signal may be fixed (or stick) to a power supply voltage level or a ground level. Generally, in a memristor, writing and erasure are performed at a voltage of about 1 V to 2 V. When the output signal of the amplifier changes to the power supply voltage level or the ground level, the data stored in the memory may be rewritten or changed. By turning on the fifth and sixth switches, a voltage follower is configured by each amplifier so as to prevent the amplifier from being in an open loop state.

Specifically, as in the neural network circuit of the present disclosure, the switching control circuit may switch on and off of the first to fourth switches with the fifth and sixth switches turned on. It may be possible to prevent voltage stress from being applied to the memristor configuring the storage portion.

First Embodiment

Figure 3:
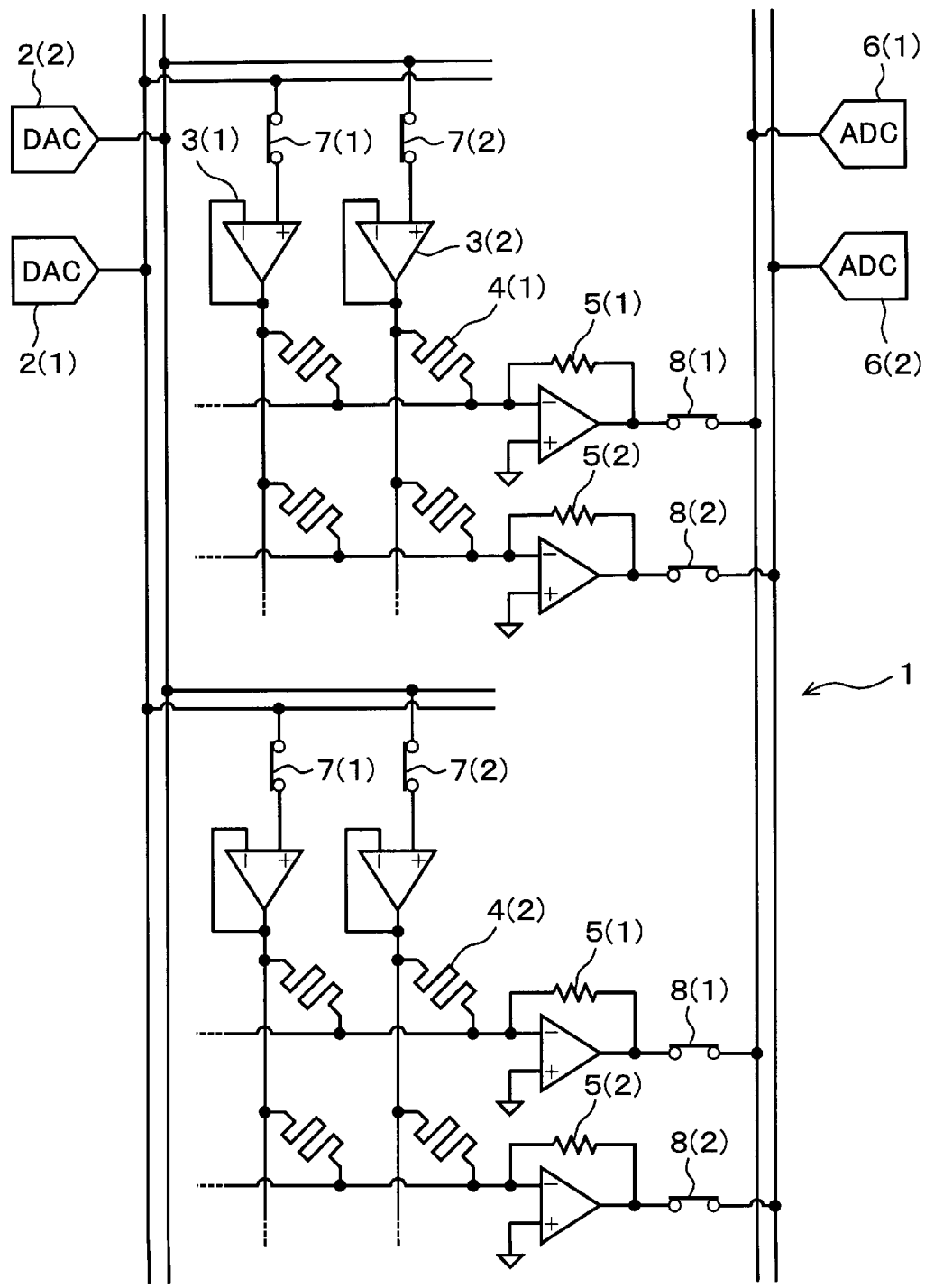
FIG. 3 is a diagram showing an example in which a CNN is configured using a crossbar circuit.

A first embodiment will be described. FIG. 3 is an example of a case where the CNN (convolutional neural network) having 10 layers shown in FIG. 11 is configured using a crossbar circuit. A CNN circuit 1 performs voltage conversion of input data by a D/A converter 2. The converted voltage is applied to the memristor crossbar circuit 4 via the drive amplifier 3. The drive amplifier 3 corresponds to a drive amplifier. The memristor crossbar circuit 4 includes a memristor as a storage element, and corresponds to a storage portion. In a configuration of the memristor crossbar circuit 4, multiple storage elements are arranged in a lattice shape.

The crossbar circuit 4 outputs a current in accordance with a conductance value that is set in each storage element. A sense amplifier 5 converts current into voltage. The sense amplifier 5 corresponds to an I/V conversion amplifier. A A/D converter 6 performs A/D conversion the output voltage of the sense amplifier 5 to be output as digital data. The A/D (analog to digital) converter may be referred to as an ADC. The D/A (digital to analog) converter may be referred to as a DAC.

FIG. 3 shows the crossbar circuit 4 being four elements of 2×2 elements, and corresponding shows two DACs 2, two drive amplifiers 3, two sense amplifiers 5 and two ADCs 6. There may be two or more crossbar circuits 4. It is assumed that the DAC 2 and the ADC 6 are shared for two or more crossbar circuits 4. In this case, as shown in FIG. 3, a switch 7 such as an analog switch may be inserted between an output terminal of the DAC 2 and a non-inversion input terminal of each drive amplifier 3. A switch 8 may be inserted between an output terminal of the sense amplifier 5 and an input terminal of the ADC 6.

With this configuration, there may be no problem with accuracy of an analog product-sum operation performed by each crossbar circuit 4. The number of the amplifiers 3 and the number of the amplifiers 5 associated with each crossbar circuit 4 may increase, which cause increase of the circuit area.

Figure 4:
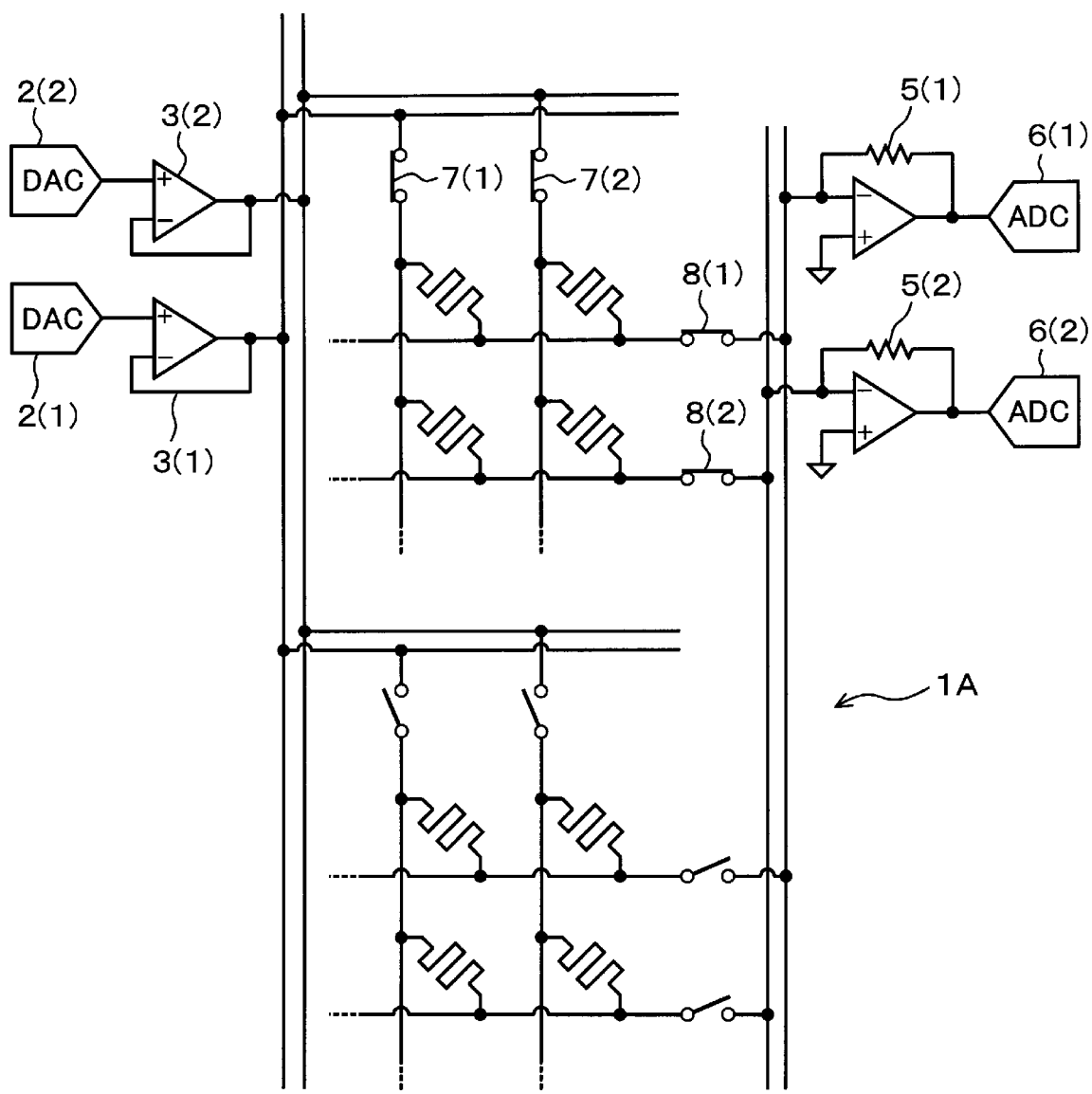
FIG. 4 is a diagram showing an example of a configuration in which a switch is inserted between an output terminal of a drive amplifier and each crossbar circuit and another switch is inserted between each crossbar circuit and a sense amplifier.

FIG. 4 shows a CNN circuit 1A. In FIG. 4, it is assumed that a switch 7 is inserted between the output terminal of the drive amplifier 3 and each crossbar circuit 4, and that a switch 8 is inserted between each crossbar circuit 4 and the sense amplifier 5. In this case, it may be possible to reduce the number of amplifiers 3 and 5 to the number accompanying one crossbar circuit 4. In this case, it may become difficult to accurately apply voltage to both ends of the memristor, which is a memory element, due to the effects of ON-resistance of the switches 7 and 8 and parasitic resistance of a wiring or the like. An error may occur in a result of the analog product-sum operation.

Figure 1:
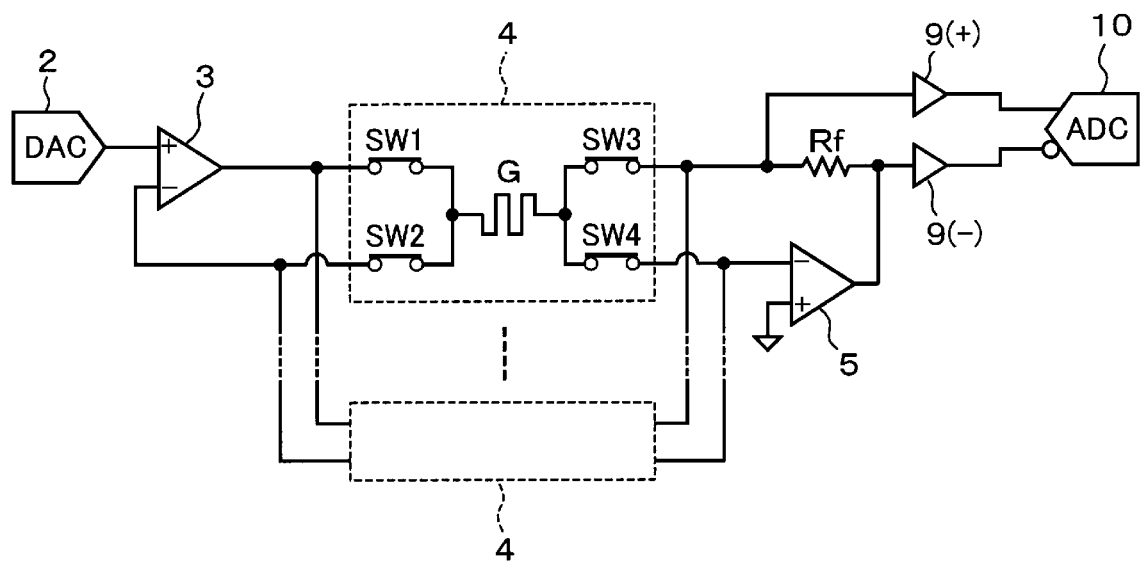
FIG. 1 is a diagram showing a peripheral circuit of one memristor in a crossbar circuit configuring a neural network circuit according to a first embodiment.

FIG. 1 shows a configuration according to the present embodiment. A series circuit having a first switch SW1 and a second switch SW2 is placed in a feedback loop of the drive amplifier 3. A series circuit having a third switch SW3 and a fourth switch SW4 is placed between a feedback resistor Rf and an inversion input terminal in a feedback loop of the sense amplifier 5. A common connection point of the switches SW1 and SW2 is connected to one end of the memristor. A common connection point of the switches SW3 and SW4 is connected to the other end of the memristor. This connection is a Kelvin connection. The side of the switches SW1 and SW3 serves as a force line, and the other side of the switches SW2 and SW4 serves as a sense line.

Both ends of the feedback resistor Rf are connected to an input terminal of the differential ADC 10 through buffers 9(+) and 9(−), which are high input resistance. As shown in FIG. 1, one end of the feedback resistor Rf is connected to the input terminal of the ADC 10 through the buffer 9(+), and the other end of the feedback resistor Rf is connected to the input terminal of the ADC 10 through the buffer 9(−). Therefore, the voltage between both ends when current flows through the feedback resistor Rf is A/D-converted by the ADC 10.

Figure 2:
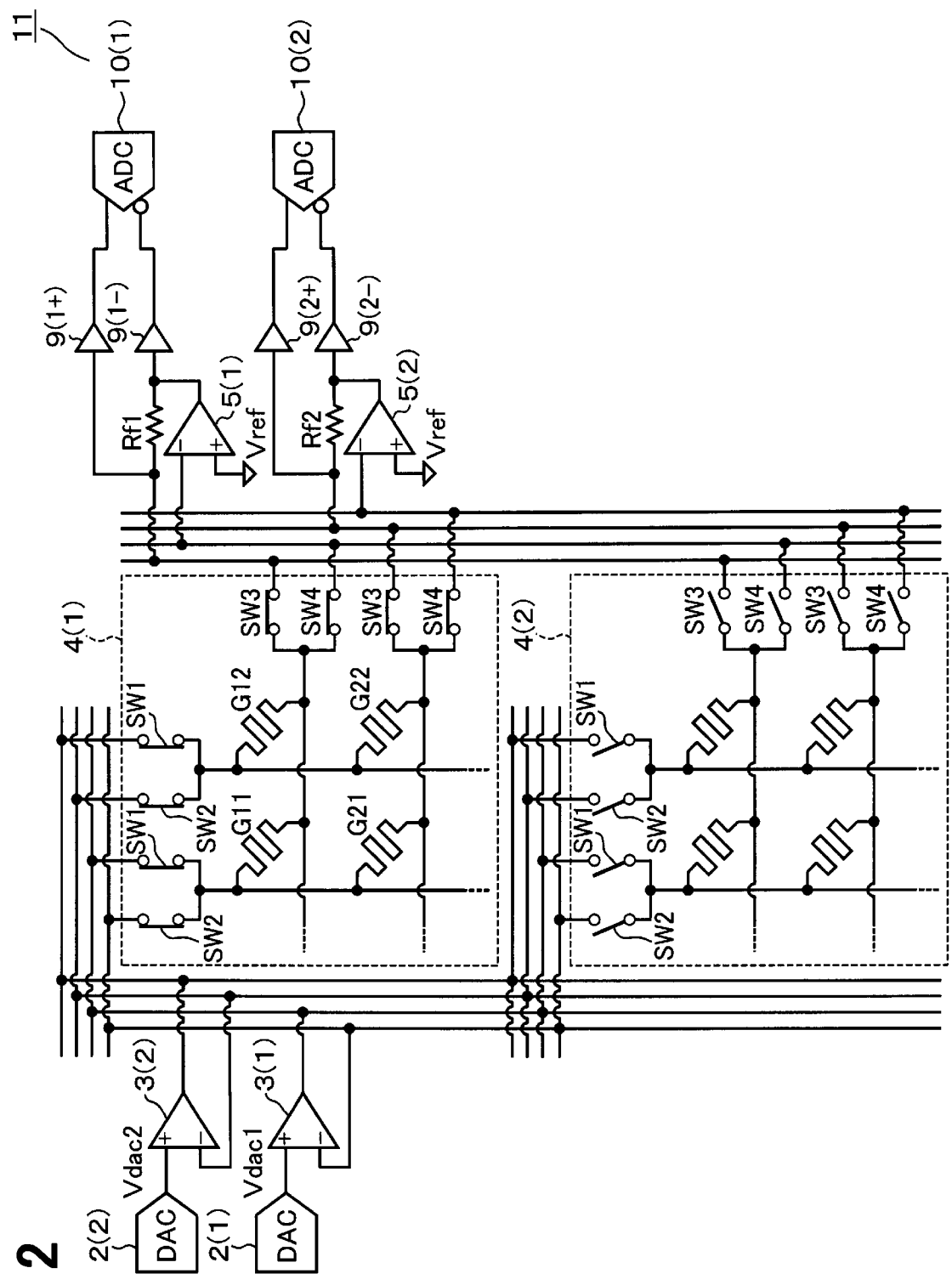
FIG. 2 is a diagram showing an overall configuration of a neural network circuit.

The configuration shown in FIG. 1 corresponds to a configuration shown in FIG. 2 with respect to multiple crossbar circuits 4, similarly with FIG. 3 and FIG. 4. In a CNN circuit 11 according to the present embodiment, the DAC 2 and the drive amplifier 3, which are positioned on an input side, and the sense amplifier 5 and the ADC 10, which are positioned on an output side, are shared by the multiple crossbar circuits 4. When the analog product-sum operation is performed in the crossbar circuit 4(1), the switches SW1 to SW4 connected to the crossbar circuit 4(1) are turned on. Switches SW1 to SW4 which are connected to the other crossbar circuits 4(2) or the like are turned off. When the analog product-sum operation is performed in the crossbar circuit 4(2), the switches SW1 to SW4 connected to the crossbar circuit 4(2) are turned on. In addition, switches SW1 to SW4 connected to the other crossbar circuits 4(1) or the like are turned off.

Analog product-sum operations by the crossbar circuits 4(1), 4(2) or the like are sequentially performed by time division. Also, instead of the configuration corresponding to a large-scale operation, multiple crossbar circuits 4 may be used as a countermeasure against malfunction due to initial failure or aging as spares.

According to the present embodiment, the CNN circuit 11 includes multiple crossbar circuits 4 in which memristors as storage elements are connected in a lattice shape, multiple D/A converters 2 which input data to apply signal voltage to multiple voltage input terminals of the crossbar circuits 4, multiple drive amplifiers 3 which are connected between the multiple D/A converters and the multiple voltage input terminals, multiple sense amplifiers 5 which are connected with a current output terminal of the crossbar circuit 4 and convert current flowing through the current output terminal into voltage to be outputted, and multiple A/D converters 10 which performs A/D conversion of the signal voltage, which is converted by the multiple sense amplifiers 5.

A series circuit of the switches SW1 and SW2 is arranged in a feedback loop of the drive amplifier 3. A series circuit of the switches SW3 and SW4 is arranged in the feedback loop of the sense amplifier 5. A common connection point of the switches SW1 and SW2 is connected to one end of the memristor. A common connection point of the switches SW3 and SW4 is connected to the other end of the memristor. The A/D converter 10 performs A/D conversion of the voltage across the feedback resistor Rf of the sense amplifier 5.

According to the configuration, it may be possible to switch for each crossbar circuit 4, the connection between the drive amplifier 3 positioned toward input of the crossbar circuit 4 and the sense amplifier 5 positioned toward output of the crossbar circuit 4 by switching the switches SW1, SW2, SW3, and SW4 on and off. Therefore, when a large scale network is configured using multiple crossbar circuits 4, it may be possible to share the D/A converter 2 and the driver amplifier 3, and the sense amplifier 5 and the A/D converter 10, and thereby it may be possible to reduce the circuit scale while maintaining the calculation accuracy.

Second Embodiment

Figure 5:
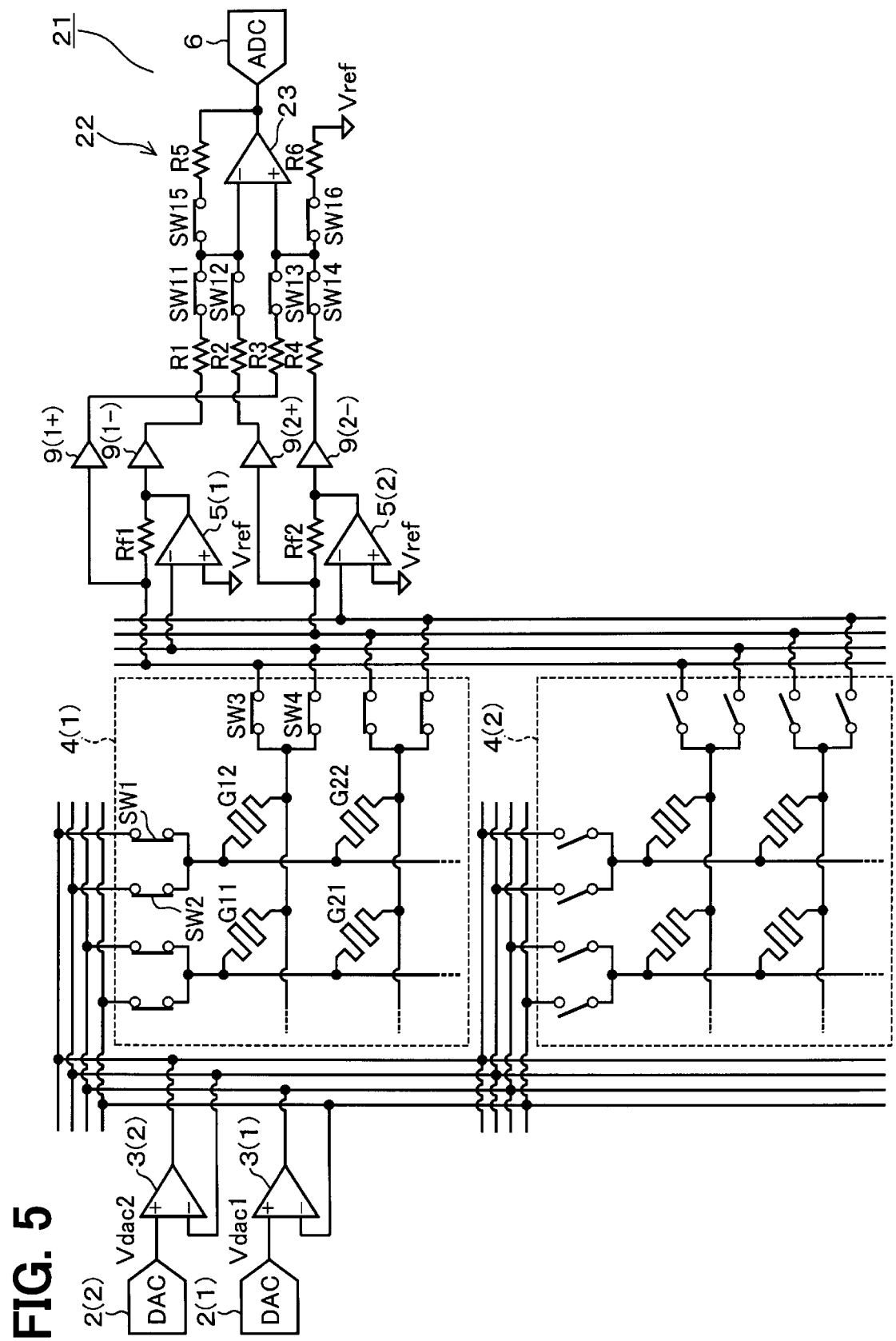
FIG. 5 is a diagram showing an overall configuration of a neural network circuit according to a second embodiment.

Hereinafter, the identical parts as those in the first embodiment will be designated by the same reference numerals, and explanations thereof will be omitted. Differences from the first embodiment will be described. As shown in FIG. 5, in a CNN circuit 21 of the second embodiment, the crossbar circuit 4 is configured with a differential output. A differential amplifier circuit 22 and the ADC 6 are connected to an output of the buffer 9. The differential amplifier circuit 22 is configured by adding resistance elements R1 to R6 and switches SW11 to SW16 to the operational amplifier 23. The switches SW11 to SW16 correspond to switches for a differential amplifier (also referred to as a differential amplifier switch).

The output terminal of the buffer 9(1+) is connected to a non-inversion input terminal of the operational amplifier 23 through a series circuit of the resistor element R3 and the switch SW13. The output terminal of the buffer 9(2−) is connected to the non-inversion input terminal through a series circuit of the resistor element R4 and the switch SW14. A reference voltage Vref is applied to the non-inversion input terminal through a series circuit of the switch SW16 and the resistor element R6.

The output terminal of the buffer 9(1−) is connected to a non-inversion input terminal of the operational amplifier 23 through a series circuit of the resistor element R1 and the switch SW11. The output terminal of the buffer 9(2+) is connected to the non-inversion input terminal through a series circuit of the resistor element R2 and the switch SW12. The inversion input terminal is connected to the output terminal of the operational amplifier 23 through a series circuit of the switch SW15 and the resistor element R5.

Operation of the second embodiment will be described. When only a result of the analog product-sum operation in the crossbar circuit 4 is obtained as a differential output, the switches SW11 to SW16 may be omitted. By providing the SW11 to SW16, when the switches SW12 and SW14 are turned off and the output voltage Vdac1 of the DAC 2(1) is made equal to Vref and a voltage is applied to the output voltage Vdac2 of the DAC 2(2), it may be possible to measure current flowing only in the memristor G12 by the ADC 6. When the switches SW12 and SW14 are turned on and the switches SW11 and SW13 are turned off, it may be possible to measure current flowing only in the memristor G22 by the ADC 6.

As described above, according to the second embodiment, the CNN circuit 21 includes buffer amplifiers 9(1+) to 9(2−) (that is, buffer amplifiers 9(1+), 9(1−), 9(2+), 9(2−)) that are connected to the both ends of the feedback resistors Rf1 and Rf2 of two sense amplifiers 5(1) and 5(2) making a pair, the differential amplifier circuit 22 that is connected to an output of the buffer amplifiers 9, and the switches SW11 to SW16 that are inserted between the input terminal of the operational amplifier 23 configuring the differential amplifier circuit 22 and the resistance elements R1 to R6. According to this configuration, it may be possible to measure current flowing in each memristor even the output of the crossbar circuit 4 corresponds to a differential configuration.

Third Embodiment

Figure 6:
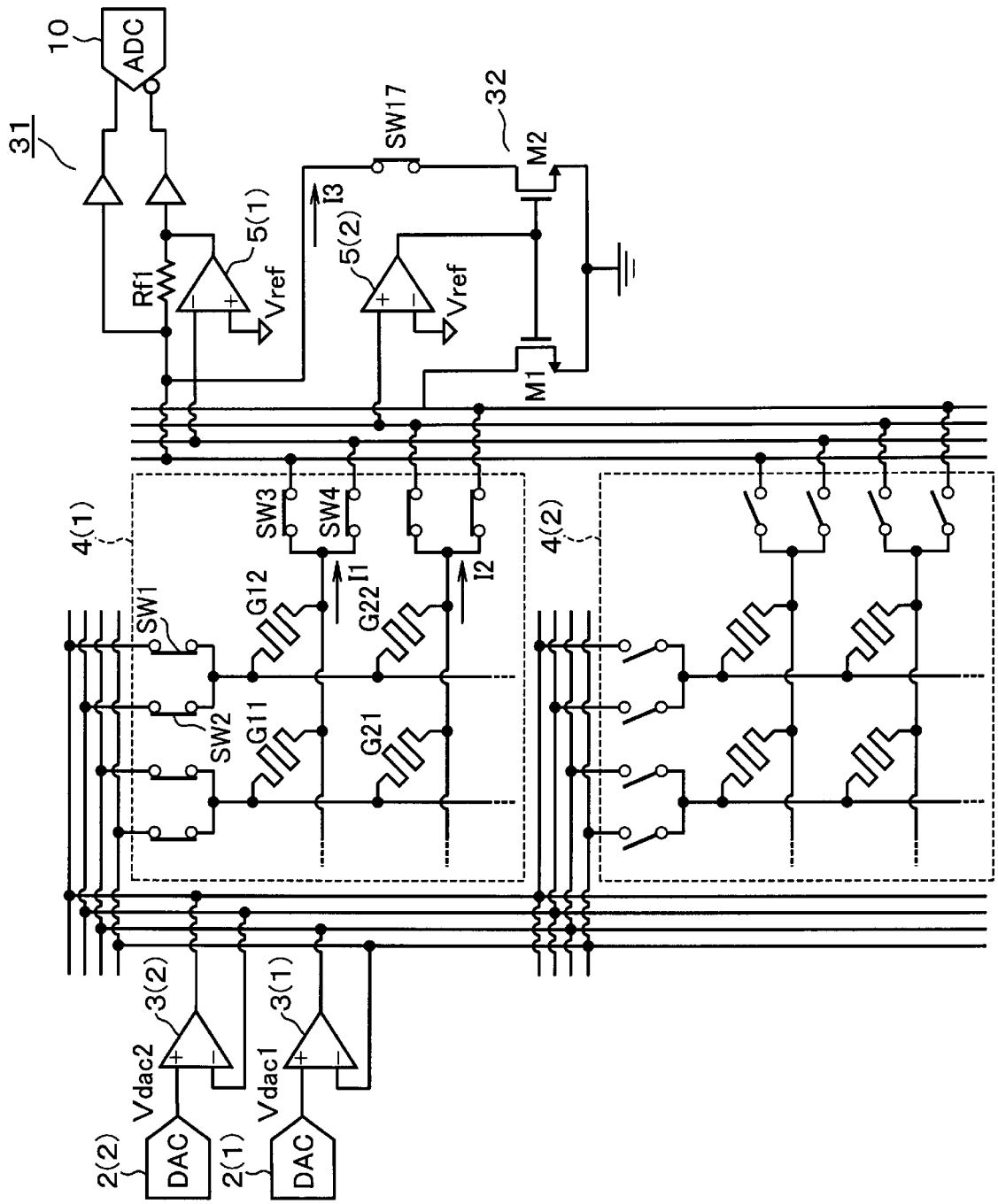
FIG. 6 is a diagram showing an overall configuration of a neural network circuit according to a third embodiment.

FIG. 6 shows a CNN circuit 31 of a third embodiment. The crossbar circuit 4 is configured with a differential output as in the second embodiment, and a configuration of the sense amplifier 5(1) is similar with the first embodiment. The sense amplifier 5(2) does not form a feedback loop without a feedback resistor Rf2. A non-inversion input terminal of the sense amplifier 5(2) is connected to the switch SW3, and the inversion input terminal receives the reference voltage Vref.

The N-channel MOSFETs M1 and M2 configure a current mirror circuit 32. Sources of the FETs M1 and M2 are connected to the ground. Drain of the FET M1 is connected to the switch SW4. Drain of the FET M2 is connected to one end of the feedback resistor Rf1 of the sense amplifier 5(1) and the input terminal of the buffer 9(1+) through the switch SW17. The output terminal of the sense amplifier 5(2) is connected to the gates of the FETs M1 and M2. The switch SW17 corresponds to a current cutoff switch.

Operation of the third embodiment will be described. It is supposed that the output current of the memristors G11 and G12 is equal to current I1. It is supposed that the output current of the memristor G21 and G22 is equal to current I2. The current mirror circuit 32 draws the current I3 obtained by mirroring the current I2 from the feedback resistor Rf1 of the sense amplifier 5(1). Therefore, the current (I1−I3) flows through the feedback resistor Rf1 The terminal voltage is measured by the ADC 10.

In the above measurement, the switch SW17 may be omitted. When the switch SW17 is turned off, the current I3 becomes zero. Therefore, it may be possible to measure the current I1 by the ADC 10. Also, when the switch SW17 is turned on to measure the current (I1−I3) and the switch SW17 is turned off to measure the current I1, based on the difference, $$I1-(I1-I3)=I3$$

is obtained. Therefore, the current I2 can also be determined individually.

As described above, according to the third embodiment, in the crossbar circuit 4, the CNN circuit 31 connects the sense amplifier 5(1) to the output terminal through which the current I1 flows, of the currents I1 and I2 making a pair, and connects the main current path of the current mirror circuit 32 to the output terminal through which the current I2 flows. The current mirror circuit 32 draws and flows the mirror current I3 obtained by mirroring the current I2 from the feedback resistor Rf1 of the sense amplifier 5(1). The switch SW17 is inserted in the path where the mirror current flows. Thus, not only the difference current (I1−I3) but also the currents I1 and I2 can be measured individually.

Fourth Embodiment

Figure 7:
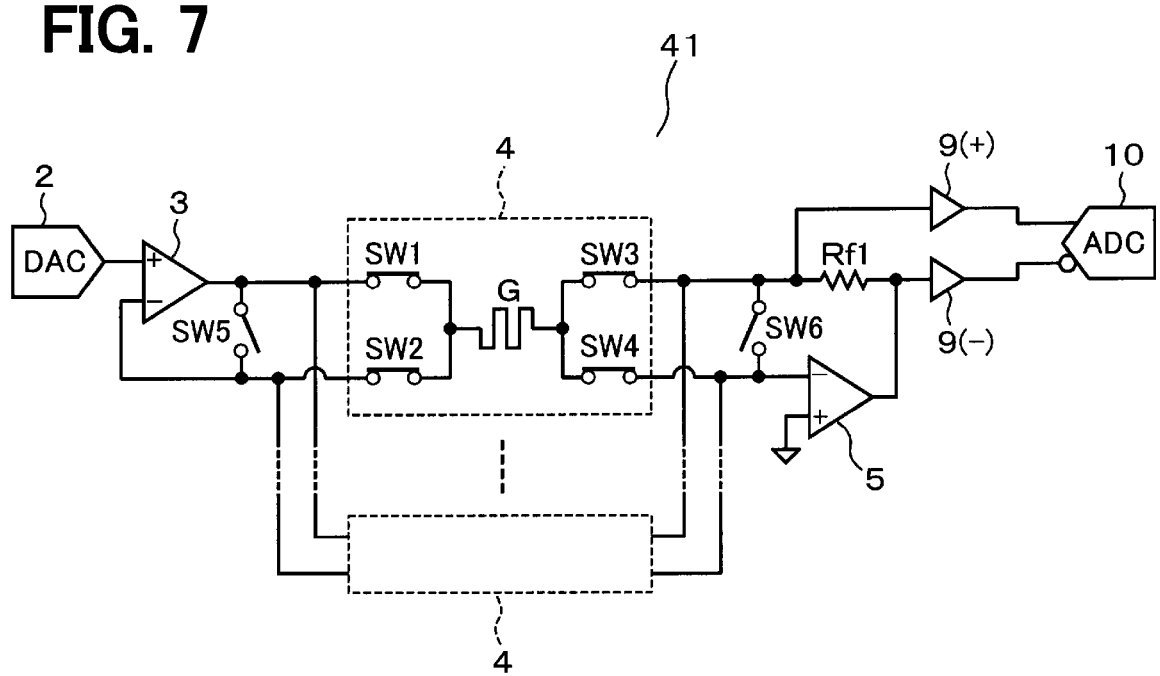
FIG. 7 is a diagram showing a peripheral circuit of one memristor in a crossbar circuit configuring a neural network circuit according to a fourth embodiment.

As shown in FIG. 7, a CNN circuit 41 of a fourth embodiment is obtained by adding fifth and sixth switches SW5 and SW6 to the configuration of the first embodiment. The switch SW5 is connected between the output terminal and the inversion input terminal of the drive amplifier 3. The switch SW6 is connected between one end of the feedback resistor Rf1 of the sense amplifier 5 and the inversion input terminal of the sense amplifier 5. By turning on the switches SW5 and SW6, both the amplifiers 3 and 5 are in a closed loop state, and a voltage follower is configured.

Operation of the third embodiment will be described. For example, when switching the crossbar circuit 4 by turning on and off the switches SW1 to SW4 in the configuration of the first embodiment, the amplifiers 3 and 5 may temporarily become open loop depending on the switching timing and the frequency characteristics of the amplifiers 3 and 5. In this case, the output level may be fixed to the power supply voltage or the ground level. In general, since a memristor is written and erased by a voltage of about 1 V to 2 V, there is a possibility that the data stored in the memristor is rewritten when the output signals of the amplifiers 3 and 5 are changed to the power supply voltage level or ground level.

In the fourth embodiment, during the on and off operation of the amplifiers 3 and 5 and the switching operation of the crossbar circuit 4, the switches SW5 and SW6 are turned on to put the amplifiers 3 and 5 in a closed loop state. It is assumed that, when the amplifiers 3 and 5 are off, these output signals are at the ground level. The on and off of each of the switches SW1 to SW6 and the power on control of the amplifiers 3 and 5 are performed by a switching control circuit (not shown).

Figure 8:
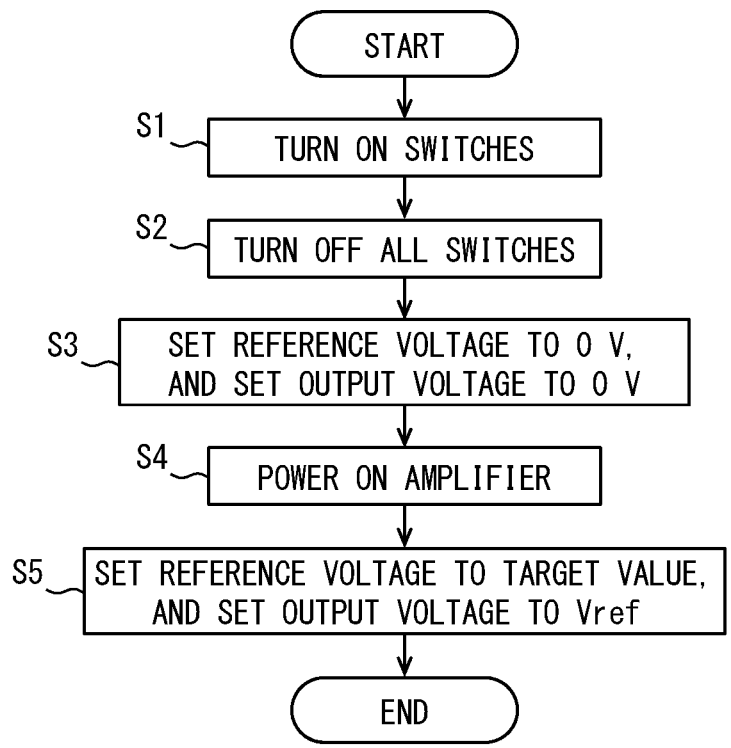
FIG. 8 is a flowchart showing an operation procedure at power on of the amplifier.

In the on operation of the amplifiers 3 and 5 shown in FIG. 8, the switches SW5 and SW6 are first turned on (S1), and then the switches SW1 to SW4 of the memristor in all the crossbar circuits 4 are turned off (S2). Next, the reference voltage Vref of the sense amplifier 3 is set to 0 V and the output voltage Vdac of the DAC 2 is set to 0 V (S3). Then, the amplifiers 3 and 5 are powered (S4), and the reference voltage Vref of the sense amplifier 3 is set to the target voltage, and the output voltage Vdac of the DAC 2 is set to the reference voltage Vref (S5).

Figure 9:
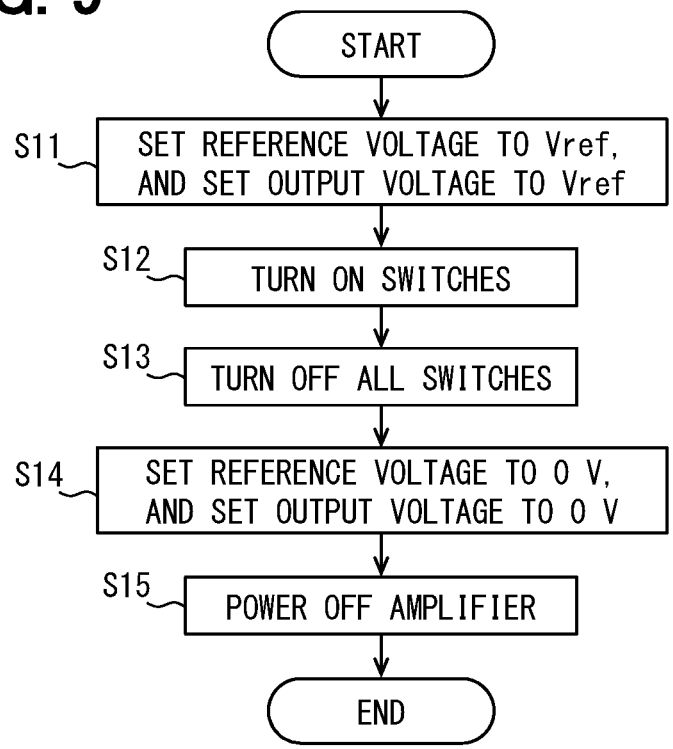
FIG. 9 is a flowchart showing an operation procedure at power off of the amplifier.

In an off operation of the amplifiers 3 and 5 shown in FIG. 9, first, the reference voltage Vref of the sense amplifier 3 is set to the same potential Vref, and the output voltage Vdac of the DAC 2 is set to the reference voltage Vref (S11). Subsequently, the similar processing as S1 to S3 is performed (S12 to S14). Then, the power to the amplifiers 3 and 5 is shut off, and the power is turned off (S15).

Figure 10:
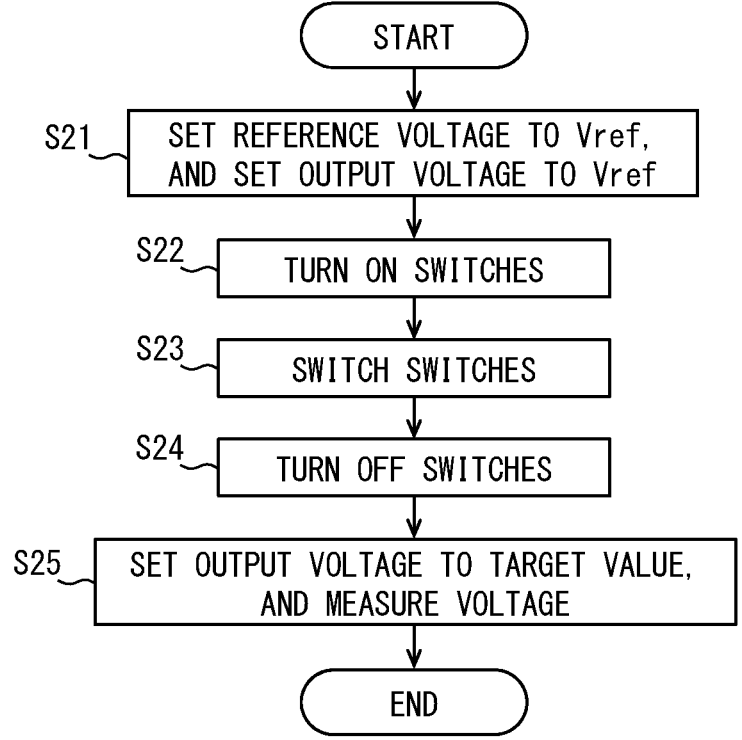
FIG. 10 is a flowchart showing a switching operation procedure of the crossbar circuit.

In a switching operation of the crossbar circuit 4 shown in FIG. 10, the similar processing as S11 and S12 are performed (S21, S22). After that, the switches SW1 to SW4 of the memristor in the crossbar circuit 4 are switched (S23). Subsequently, the switches SW5 and SW6 are turned off (S24), the output voltage Vdac of the DAC 2 is set to the target voltage, and the voltage of the feedback resistor Rf is measured by the ADC 10 (S25).

As described above, according to the fourth embodiment, in the CNN circuit 41, the fifth switch SW5 is connected between the output terminal of the drive amplifier 3 and the inversion input terminal of the drive amplifier 3. The sixth switch SW6 is connected between the inversion input terminal of the sense amplifier 5 and the one end of the feedback resistor Rf. It may be possible to configure a voltage follower when turning on the switches SW5 and SW6 and making the amplifiers 3 and 5 be in a closed loop state. Then, by switching the switches SW1 to SW4 on and off in a state where the switches SW5 and SW6 are turned on with the switching control circuit, it may be possible to prevent voltage stress from being applied to the memristor configuring the crossbar circuit 4.

Although the present disclosure has been described in accordance with the examples, it is understood that the disclosure is not limited to such examples or structures. The present disclosure covers various modification examples and equivalent arrangements. Furthermore, various combination and formation, and other combination and formation including one, more than one or less than one element may be made in the present disclosure.

It is noted that a flowchart or the processing of the flowchart in the present application includes multiple steps (also referred to as sections), each of which is represented, for instance, as S1. Further, each step can be divided into several sub-steps while several steps can be combined into a single step.

While various embodiments, configurations, and aspects of a neural network circuit according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:
1. A neural network circuit comprising:
a plurality of storage portions that include a memristor, the memristor being a variable resistance element as a storage element and being connected in a lattice shape;
a plurality of D/A converters that receive data, causing a signal voltage to be applied to a plurality of voltage input terminals of the storage portions;

a plurality of drive amplifiers that are connected between to the D/A converters and the voltage input terminals;

a plurality of I/V conversion amplifiers that are connected to at least one current output terminal of the storage portions and are configured to convert a current flowing in the current output terminal into voltage to be output as a signal voltage;

a plurality of A/D converters that are configured to perform A/D conversion of the signal voltage, which is converted by the I/V conversion amplifiers;

a series circuit of a first switch and a second switch that is disposed in a feedback loop of each of the drive amplifiers; and a series circuit of a third switch and a fourth switch that is disposed in a feedback loop of each of the I/V conversion amplifiers, wherein:

a common connection point of the first switch and the second switch is connected to one end of the memristor;

a common connection point of the third switch and the fourth switch is connected to another end of the memristor; and the A/D converter performs A/D conversion of voltage across a feedback resistor of the I/V conversion amplifier.

2. The neural network circuit according to claim 1, further comprising:

a fifth switch that is connected between an output terminal of the drive amplifier and an inversion input terminal of the drive amplifier; and a sixth switch that is connected between an inversion input terminal of the I/V conversion amplifier and one end of the feedback resistor.

3. The neural network circuit according to claim 2, further comprising:

a switching control circuit that is configured to switch on and off of the first to fourth switches, wherein:

the switching control circuit switches on and off of the first to fourth switches in a state where the fifth switch and the sixth switch are in an on state.

4. The neural network circuit according to claim 1, further comprising:

a first and second buffer amplifiers that are respectively connected to both ends of a first feedback resistor of a first I/V conversion amplifier of the I/V conversion amplifiers;

a third and fourth buffer amplifiers that are connected to both ends of a second feedback resistor of a second I/V conversion amplifier of the I/V conversion amplifiers, the second I/V conversion amplifier forming a pair with respect to the first I/V conversion amplifier;

a differential amplifier circuit that is connected to output of the first to fourth buffer amplifiers, the differential amplifier including an amplifier and a resistance element; and a differential amplifier switch that is positioned between an input terminal of the amplifier of the differential amplifier circuit and the resistance element.

5. The neural network circuit according to claim 1, wherein:

the I/V conversion amplifier is connected to one of the two current output terminals which form a pair, the neural network circuit further comprising:

a current mirror circuit that causes a main current path to be connected to a different of the two current output terminals which form the pair, and draws a mirror current obtained by mirroring current flowing through the different of the two current output terminals from a feedback resistor of the I/V conversion amplifier; and a current cutoff switch that is positioned in a path where the mirror current flows.

* * * * *